United States Patent
Chrysler et al.

(10) Patent No.: US 7,538,476 B2
(45) Date of Patent: May 26, 2009

(54) MULTI-LAYER PIEZOELECTRIC ACTUATORS WITH CONDUCTIVE POLYMER ELECTRODES

(75) Inventors: Gregory M. Chrysler, Chandler, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 11/694,762

(22) Filed: Mar. 30, 2007

(65) Prior Publication Data

US 2008/0238248 A1    Oct. 2, 2008

(51) Int. Cl.
H01L 41/047 (2006.01)
H01L 41/083 (2006.01)
H01L 41/187 (2006.01)

(52) U.S. Cl. .......................... 310/363; 310/328; 310/358
(58) Field of Classification Search .................. 310/363, 310/328, 358
See application file for complete search history.

(56) References Cited

U.S. PATENT DOCUMENTS

| | | | |
|---|---|---|---|
| 4,627,138 A | * | 12/1986 | Im ............................. 29/25.35 |
| 6,376,971 B1 | * | 4/2002 | Pelrine et al. ................ 310/363 |
| 6,867,533 B1 | * | 3/2005 | Su et al. ....................... 310/328 |
| 2002/0050769 A1 | * | 5/2002 | Pelrine et al. ................ 310/363 |

FOREIGN PATENT DOCUMENTS

| | | | |
|---|---|---|---|
| JP | 1-157060 | * | 6/1989 |
| JP | 2002-22561 | * | 1/2002 |

OTHER PUBLICATIONS

Saito, Yasuyoshi, et al., "High Performance Lead-free Piezoelectric Material," R&D Review of Toyota CRDL, (2004), pp. 22-28, vol. 41, No. 2.
Sauciuc, Ioan, "Piezo Actuators for Electronics Cooling," Electronics Cooling, Feb. 2007, 6 pages, vol. 13, No. 1.
Odegard, G. M., "Constitutive Modeling of Piezoelectric Polymer Composites," Acta Materialia, (2004), pp. 1-29, vol. 52, No. 18.
Zeysing, B., "Processing of Conductive Polymers by Dispersion," ORMECON, (2006), 1 page, Dublin, Ireland.

* cited by examiner

Primary Examiner—Thomas M Dougherty
(74) Attorney, Agent, or Firm—Blakely, Sokoloff, Taylor & Zafman LLP

(57) ABSTRACT

A multi-layer piezoelectric actuator with conductive polymer electrodes is described. The piezoelectric actuator comprises a stack of alternating conductive electrode layers and piezoelectric layers. The conductive electrode layers are comprised of a polymeric electrically conductive material. A device for cooling by forced-air convection may comprise the piezoelectric actuator, a fan blade and an alternating current supply. The piezoelectric actuator coupled with the fan blade and the alternating current supply, which is provided for vibrating the fan blade. A method of cooling by forced-air convection comprises supplying an alternating current to the piezoelectric actuator, wherein the alternating current has a frequency and causes the fan blade to vibrate with the same frequency.

30 Claims, 5 Drawing Sheets

MULTI-LAYER PIEZOELECTRIC ACTUATORS WITH CONDUCTIVE POLYMER ELECTRODES

BACKGROUND OF THE INVENTION

1) Field of the Invention

The invention is in the fields of Piezoelectric Actuators and Cooling Devices for Computing Systems.

2) Description of Related Art

Today's consumer electronics market frequently demands complex functions requiring high power. Power issues become more disconcerting as platforms shrink in size and/or become mobile, e.g. hand-held devices. The cooling issues for such devices may be more complex and significantly different from those for the traditional large form-factor devices such as desk-tops and servers. For example, a cooling system based on forced-air convection may not be the most efficient system for desk-tops and servers, but does enable a compact arrangement for smaller and/or mobile devices.

A piezoelectric actuator-based fan may be used in a forced-air convection cooling system for small and/or mobile electronics devices. FIG. 1A illustrates a cross-sectional view representing a fan having a piezoelectric actuator, in accordance with the prior art. Referring to FIG. 1A, a piezoelectric actuator fan 100 comprises a multi-layer piezoelectric actuator 102 attached to a blade 104. The multi-layer piezoelectric actuator 102 is comprised of alternating conductive electrode layers 106 and piezoelectric layers 108. The crystal morphology of piezoelectric layers 108 changes in response to a voltage being applied across conductive electrode layers 106. As a result, blade 104 is caused to move by way of a tip-to-tip displacement, as depicted by the dashed lines in FIG. 1A. The tip-to-tip displacement can invoke airflow for use in a forced-air convection cooling system.

Unfortunately, using conventional materials (such as Ni, Ag and or Pd for the conductive electrode layer) to fabricate a multi-layer piezoelectric actuator may have its limitations. For example, attempts to increase the tip-to-tip displacement of the blade in a piezoelectric actuator-based fan by adding more alternating conventional conductive electrode layers and piezoelectric layers actually may have the opposite effect. FIG. 1B is a plot of tip-to-tip displacement of the blade in a fan having a piezoelectric actuator as a function of input voltage, in accordance with the prior art. Referring to FIG. 1B, as the number of layers is increased in a multi-layer piezoelectric actuator, the tip-to-tip displacement is reduced at a given input voltage. Therefore, there is a limitation on the tip-to-tip displacement of the blade in a piezoelectric actuator-based fan when using conventional materials to fabricate the conductive electrode layers in the multi-layer piezoelectric actuator.

Thus, a multi-layer piezoelectric actuator with conductive polymer electrodes is described herein.

DETAILED DESCRIPTION

A multi-layer piezoelectric actuator with conductive polymer electrodes is described. In the following description, numerous specific details are set forth, such as operating conditions and material regimes, in order to provide a thorough understanding of the present invention. It will be apparent to one skilled in the art that the present invention may be practiced without these specific details. In other instances, well-known features, such as integrated circuit design layouts, are not described in detail in order to not unnecessarily obscure the present invention. Furthermore, it is to be understood that the various embodiments shown in the Figures are illustrative representations and are not necessarily drawn to scale.

Disclosed herein is a multi-layer piezoelectric actuator with conductive polymer electrodes. The piezoelectric actuator may comprise a stack of alternating conductive electrode layers and piezoelectric layers. In an embodiment, the conductive layers are comprised of a polymeric electrically conductive material. A device for cooling by forced-air convection may comprise the piezoelectric actuator, a fan blade and an alternating current supply. In one embodiment, the piezoelectric actuator is coupled with the fan blade and with the alternating current supply. The alternating current supply is for vibrating the fan blade. A method of cooling by forced-air convection may comprise supplying an alternating current to the piezoelectric actuator. In one embodiment, the alternating current has a frequency and causes the fan blade to vibrate at the same frequency.

A multi-layer piezoelectric actuator with conductive polymer electrodes may be used to fabricate a piezoelectric actuator-based fan with a greater tip-to-tip displacement than one based on conventional conductive electrodes. By reducing the modulus of elasticity of the conductive electrodes in a multi-layer piezoelectric actuator, more layers may be added without significantly stiffening the actuator. Hence, in accordance with an embodiment of the present invention, the stiffness of a fan blade coupled with a multi-layer piezoelectric actuator having conductive polymer electrodes does not increase significantly with an increasing number of alternating conductive electrode layers and piezoelectric layers. In one embodiment, the piezoelectric response is thus idealized, in that a greater number of layers results in a greater tip-to-tip displacement of the attached fan blade. In another embodiment, by incorporating more layers, a reduced input voltage need be applied in order to achieve the same tip-to-tip fan displacement.

Figure 1A:
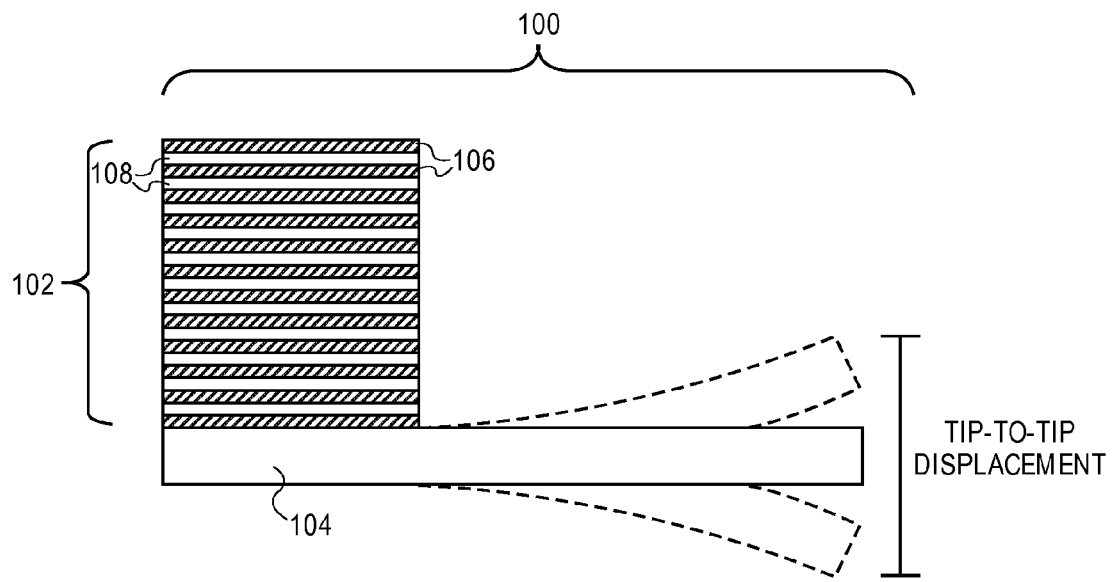
FIG. 1A illustrates a cross-sectional view representing a fan having a piezoelectric actuator, in accordance with the prior art.
Figure 1B:
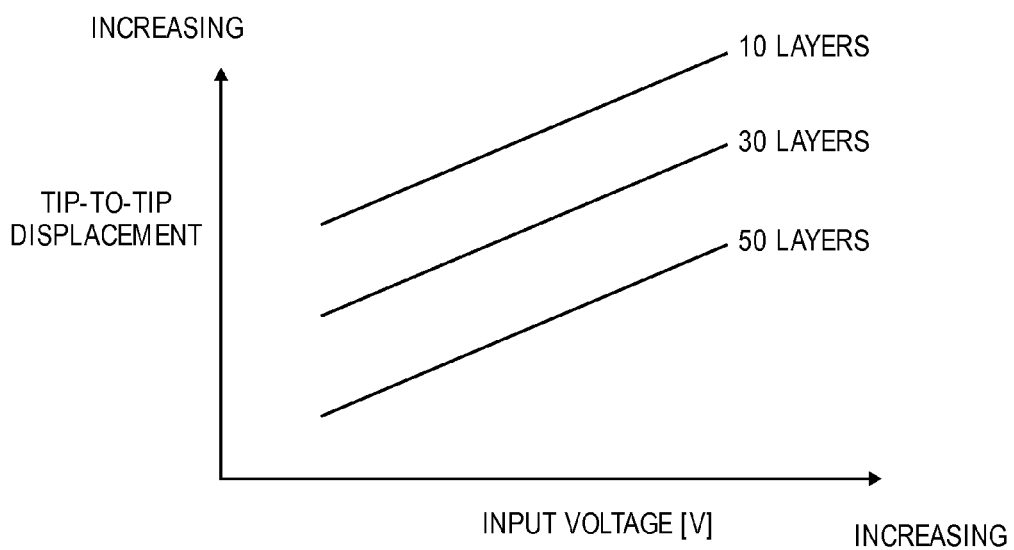
FIG. 1B is a plot of tip-to-tip displacement of the blade in a fan having a piezoelectric actuator as a function of input voltage, in accordance with the prior art.
Figure 2:
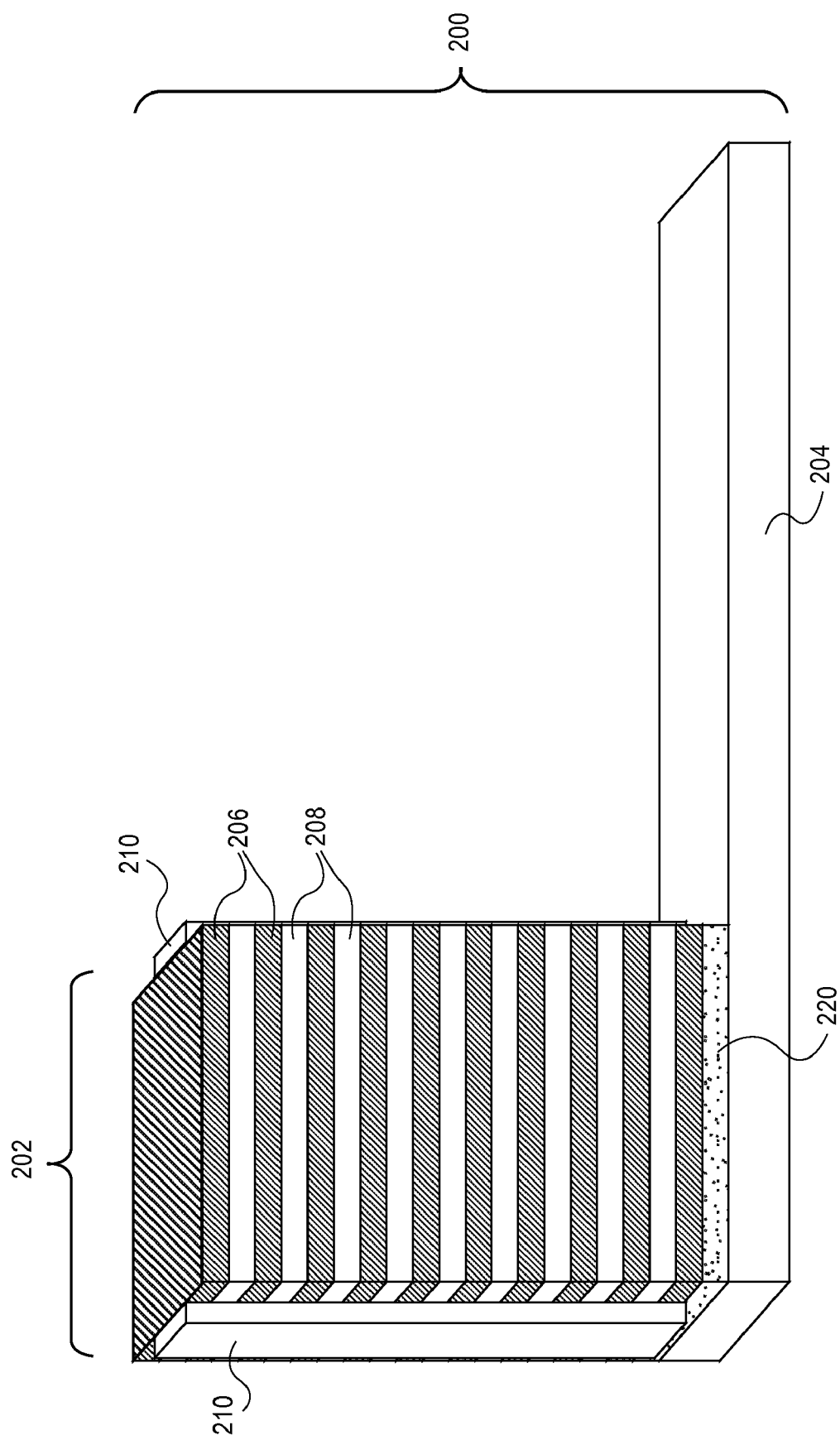
FIG. 2 illustrates a cross-sectional view representing a fan having a piezoelectric actuator with polymeric electrically conductive electrode layers, in accordance with an embodiment of the present invention.

A piezoelectric actuator may comprise a stack of alternating conductive electrode layers and piezoelectric layers, wherein the conductive electrode layers are comprised of a polymeric electrically conductive material. FIG. 2 illustrates a cross-sectional view representing a fan having a piezoelectric actuator with polymeric electrically conductive electrode layers, in accordance with an embodiment of the present invention.

Referring to FIG. 2, a piezoelectric actuator fan 200 comprises a multi-layer piezoelectric actuator 202 bonded to a blade 204 via a bonding layer 220. The multi-layer piezoelectric actuator 202 is comprised of alternating conductive electrode layers 206 and piezoelectric layers 208. Conductive layers 210 run along the sides of multi-layer piezoelectric actuator 202.

Multi-layer piezoelectric actuator 202 may be any actuator comprised of alternating electrode layers and piezoelectric layers, i.e. an actuator having at least one piezoelectric layer. In accordance with an embodiment of the present invention, multi-layer piezoelectric actuator 202 is a component of a piezoelectric actuator fan 200, as depicted in FIG. 2. In one embodiment, piezoelectric actuator fan 200 is a device for cooling by forced-air convection. However, it is to be understood that the present invention encompasses actuators for moving or controlling any mechanism or system. Thus, in accordance with an alternative embodiment of the present invention, multi-layer piezoelectric actuator 202 is a component of a system selected from the group consisting of a blower, a synthetic jet, a fluid pump, a compressor, a positioning system and a buzzer.

Conductive electrode layers 206 may be comprised of any suitable polymeric electrically conductive material. For example, conductive electrode layers may be comprised of a material that does not significantly increase the stiffness of an actuator stack in response to an increased number of layers in the actuator stack. Thus, in an embodiment, conductive electrode layers 206 are comprised of a polymeric electrically conductive material with a low modulus of elasticity. In one embodiment, the polymeric electrically conductive material has a modulus of elasticity in the range of 5-50 MPa. In a specific embodiment, the polymeric electrically conductive material is selected from the group consisting of dispersed polyaniline, polyacetylene, polypyrrole, polythiophene, polynaphthalene and derivatives thereof. The material of conductive electrode layers 206 may further have a conductivity sufficient to deliver an input voltage to piezoelectric layers 208. In one embodiment, the polymeric electrically conductive material has a conductivity of at least $1 \times 10^{-5}$ S/cm. The polymeric electrically conductive material of conductive electrode layers 206 may be more resistive than conventional conductive materials used for electrodes. In one embodiment, the resistivity may be two orders of magnitude greater than the resistivity of a conventional conductor. However, in accordance with an embodiment of the present invention, so long as the resistivity is less than approximately $5 \times 10^{-3}$ ohm·cm, the additional power needed for conductive electrode layers 206 as compared with conventional conductive electrode layers is negligible. In one embodiment, the additional power is less than approximately 0.05 mW.

Piezoelectric layers 208 may be comprised of any material suitable to mechanically respond to an input voltage. In an embodiment, piezoelectric layers 208 are comprised of a ceramic material selected from the group consisting of lead zirconium titanate (PZT) and a lead-free ceramic material exhibiting a strong piezoelectric effect. In one embodiment, the lead-free ceramic material is selected from the group consisting of $(K_{0.44}Na_{0.52}Li_{0.04})(Nb_{0.86}Ta_{0.10}Sb_{0.04})O_3$ and $\{(K_{0.5}Na_{0.5})_{1-x}Li_x\}(Nb_{1-y}Ta_y)O_3$ where x and y=0.06 and 0, 0.04 and 0.10, or 0.03 and 0.20. In an alternative embodiment, piezoelectric layers 208 are comprised of a polymeric piezoelectric material selected from the group consisting of a graphite/poly(vinylidene fluoride) composite, a silicon carbide/poly(vinylidene fluoride) particulate composite, a fibrous PZT/polyimide composite and a PZT/polyimide particulate composite. Piezoelectric layers 208 may be arranged among conductive electrode layers 206 in any fashion suitable to optimize the piezoelectric response of each layer. In one embodiment, each piezoelectric layer 208 is sandwiched between two conductive electrode layers 206, as depicted in FIG. 2.

Conductive layers 210 may be comprised of any electrical input system suitable to provide an input voltage to piezoelectric layers 208 via conductive electrodes 206. In one embodiment, conductive layers 210 comprise a strip of conductive material that runs along side the stack of piezoelectric layers 208 and conductive electrodes 206, as depicted in FIG. 2. In an alternative embodiment, conductive layers 210 represent a series of wires, each coupled with a distinct conductive electrode. The electrical input system may be arranged to optimize the effect of the input voltage provided to piezoelectric layers 208 via conductive electrodes 206. In one embodiment, two conductive layers 210 are arranged to provide an alternating current (A/C) in parallel to conductive electrodes 206, as depicted in FIG. 2.

Blade 204 may be comprised of any material suitable to be displaced via mechanical force from an attached piezoelectric actuator stack. In accordance with an embodiment of the present invention, blade 204 is sufficiently stiff to invoke an airflow upon displacement of the tip of blade 204, but is sufficiently flexible to avoid cracking or breaking during such displacement. In one embodiment, blade 204 is comprised of a material selected from the group consisting of steel, a stiff rubber composite and a flexible plastic composite.

Bonding layer 220 may be comprised of any material suitable to bond multi-layer piezoelectric actuator 202 to blade 204 without significantly mitigating the mechanical forces generated by multi-layer piezoelectric actuator 202. In one embodiment, bonding layer 220 is comprised of epoxy and is used to bond multi-layer piezoelectric actuator 202 to blade 204 following the fabrication of multi-layer piezoelectric actuator 202. In another embodiment, multi-layer piezoelectric actuator 202 is fabricated on blade 204 by first dispersing a conductive polymer on the surface of bonding layer 220. The alternating stack of conductive layers and peizoelecteric layers is then fabricated by successive deposition steps on blade 204.

The dimensions of piezoelectric actuator fan 200 may be any size suitable to provide an airflow in a convection cooling system while being efficiently packaged in a small and/or mobile computing device. In accordance with an embodiment of the present invention, the dimensions of the multi-layer piezoelectric actuator 202 are determined by the required size of the conductive electrode layers 206. By using a polymeric electrically conductive material for conductive electrode layers 206, a thinner layer may be used relative to conventional conductive layers. In an embodiment, a greater number of piezoelectric layers may be incorporated into a given space as a result of the reduced thickness of conductive electrode layers 206. In one embodiment, the thickness of each of the conductive electrode layers in the stack is less than approximately 10 microns. In a specific embodiment, the size each of the conductive electrode layers in the stack is approximately 5 microns thick, 1 centimeter wide and 2 centimeters long. In an embodiment, the number of conductive electrode layers in said stack is in the range of 2-50.

Figure 3A:
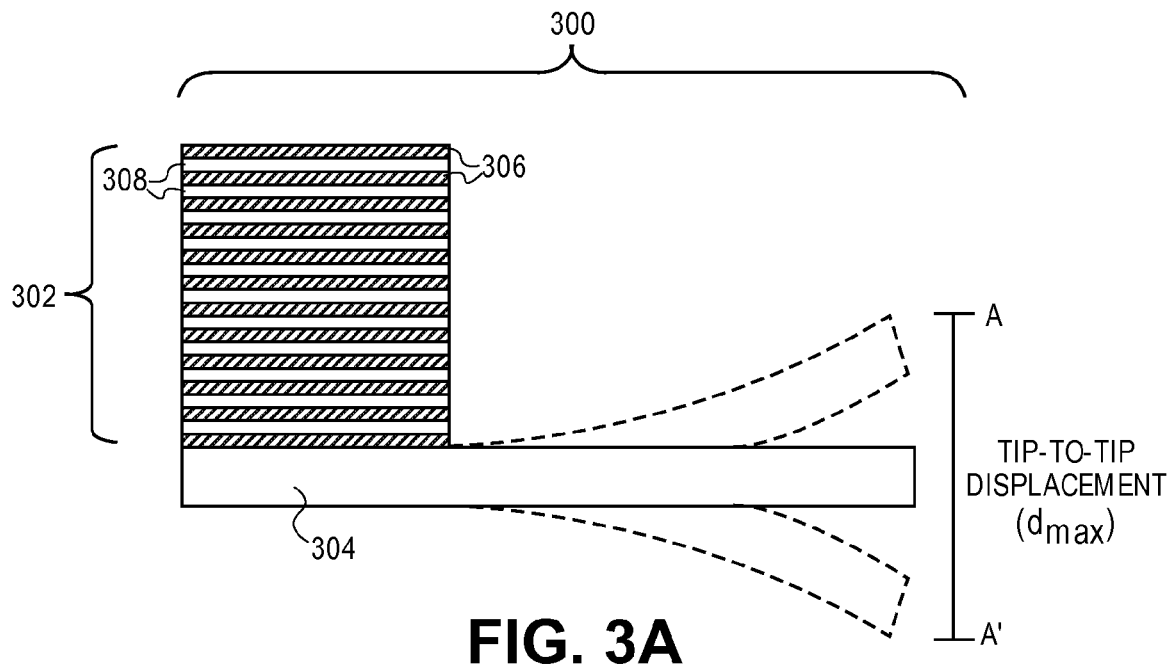
FIG. 3A illustrates a cross-sectional view representing the tip-to-tip displacement of a blade in a fan having a piezoelectric actuator with polymeric electrically conductive electrode layers, in accordance with an embodiment of the present invention.

The fan blade of a piezoelectric actuator fan may vibrate back and forth in response to a multi-layer piezoelectric actuator. FIG. 3A illustrates a cross-sectional view representing the tip-to-tip displacement of a blade in a fan having a piezoelectric actuator with polymeric electrically conductive electrode layers, in accordance with an embodiment of the present invention.

Referring to FIG. 3A, a piezoelectric actuator fan 300 comprises a multi-layer piezoelectric actuator 302 attached to a blade 304. The multi-layer piezoelectric actuator 302 is comprised of alternating polymeric electrically conductive electrode layers 306 and piezoelectric layers 308. The crystal morphology of piezoelectric layers 308 changes in response to a voltage being applied across polymeric electrically conductive electrode layers 306. When an alternating current is used, blade 304 is caused to move by way of a tip-to-tip displacement, as depicted by the dashed lines in FIG. 3A. The tip-to-tip displacement can invoke an airflow for use in a forced-air convection cooling system.

The tip-to-tip displacement of the blade illustrated in FIG. 3A may be represented by the equation $d_{max}=K_C \times (WL^3/EI)$, where $d_{max}$ is the maximum deflection (usually measured in millimeters), $K_C$ is a constant which depends on loading and end support conditions, W is the total load, L is the effective span, I is the moment of inertia and E is the modulus of elasticity. That is, as the modulus of elasticity goes up (i.e. as the blade stiffens), the maximum deflection goes down. However, as the modulus of elasticity goes down, (i.e. as the blade becomes more flexible), the maximum deflection goes up. An actuator attached to the blade can add to the stiffness of the blade if high modulus materials are used to fabricate the actuator. However, in accordance with an embodiment of the present invention, low modulus materials are used to fabricate the electrode layers of a multi-layer piezoelectric actuator. Thus, the contribution of the actuator to the stiffness of the blade is mitigated. In one embodiment, by mitigating any stiffening effect by the actuator on the blade, an increased number of layers in the actuator will lead to an increased tip-to-tip displacement. In a specific embodiment, the tip-to-tip displacement is in the range of 10-20 millimeters.

The frequency of the tip-to-tip displacement of a blade in a piezoelectric fan may be substantially the same frequency as that of an alternating current applied to the multi-layer piezoelectric actuator. Referring to FIG. 3A, one cycle of the fan blade displacement is represented as motion from the position A to A' and then back to A (or from A' to A and then back to A'). In accordance with an embodiment of the present invention, the frequency of the tip-to-tip cycle is exactly the same as the frequency of the alternating current. The frequency of the alternating current may be selected to be outside of the scope of regular audible frequencies and thus may be selected to mitigate the noise generated by the piezoelectric fan. In one embodiment, the frequency of the alternating current and, hence, the frequency of the fan blade tip-to-tip displacement is selected to be below a regular audible frequency and is less than approximately 100 Hz. In an alternative embodiment, the frequency of the alternating current and, hence, the frequency of the fan blade tip-to-tip displacement is selected to be above a regular audible frequency and is greater than approximately 20 kHz.

Figure 3B:
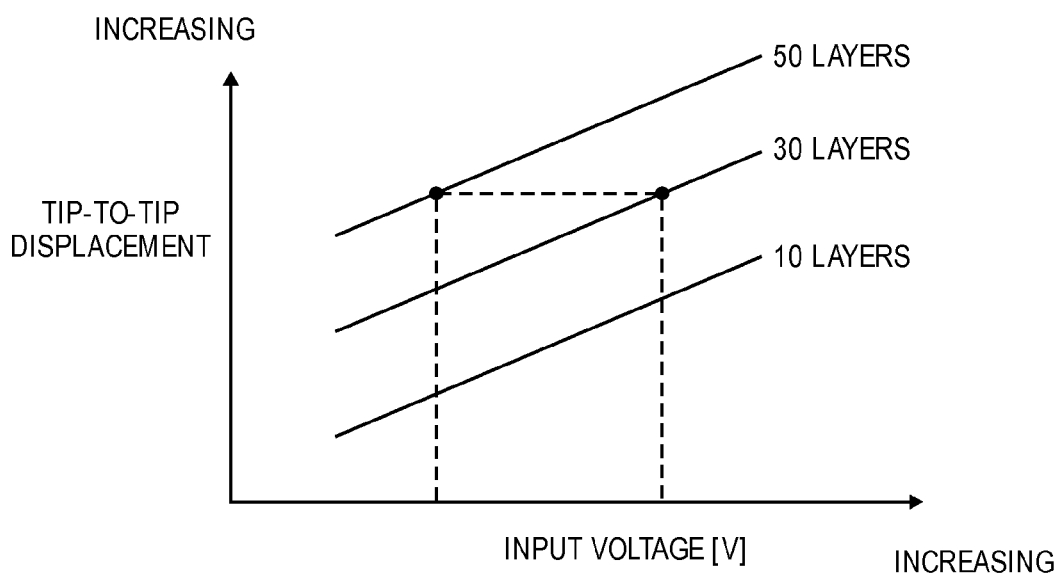
FIG. 3B is a plot of tip-to-tip displacement of the blade in a fan having a piezoelectric actuator with polymeric electrically conductive electrode layers as a function of input voltage, in accordance with an embodiment of the present invention.

By using a low modulus polymeric electrically conductive material to fabricate the conductive electrodes in a multilayer piezoelectric actuator, the piezoelectric effect on a fan blade may be idealized. That is, in accordance with an embodiment of the present invention, the addition of layers to the multi-layer piezoelectric actuator does not significantly increase the stiffness the fan blade. Thus, the response by the fan blade to the multi-layer piezoelectric actuator may be nearly idealized. In one embodiment, the tip-to-tip displacement of the fan blade increases with an increasing number of alternating conductive electrode layers and piezoelectric layers. FIG. 3B is a plot of tip-to-tip displacement of the blade in a fan having a piezoelectric actuator with polymeric electrically conductive electrode layers as a function of input voltage, in accordance with an embodiment of the present invention. Referring to FIG. 3B, as the number of layers in a multi-layer piezoelectric actuator is increased, the tip-to-tip displacement of an attached fan blade is increased at a given input voltage. Therefore, in accordance with an embodiment of the present invention, additional low modulus polymeric electrically conductive layers in the multi-layer piezoelectric actuator do not substantially interfere with the stiffness of the blade. In one embodiment, the effect of the multi-layer piezoelectric actuator on the stiffness of the fan blade is mitigated even further by using low modulus polymeric piezoelectric layers in addition to low modulus conductive electrode layers.

Referring again to FIG. 3B, by using a low modulus polymeric electrically conductive material to fabricate the conductive electrodes in a multi-layer piezoelectric actuator, a desired fixed tip-to-tip displacement may be achieved at a lower input voltage. For example, as illustrated by the dashed lines in FIG. 3B, the voltage input required for a 50 layer piezoelectric actuator to effect a desired tip-to-tip displacement is less than the voltage input required for a 30 layer piezoelectric actuator to effect the same tip-to-tip displacement. Thus, in accordance with an embodiment of the present invention, the number of piezoelectric layers and low modulus polymeric electrically conductive materials is increased in order to decrease the required input voltage for a desired tip-to-tip displacement in a piezoelectric actuator-based fan system.

Figure 4:
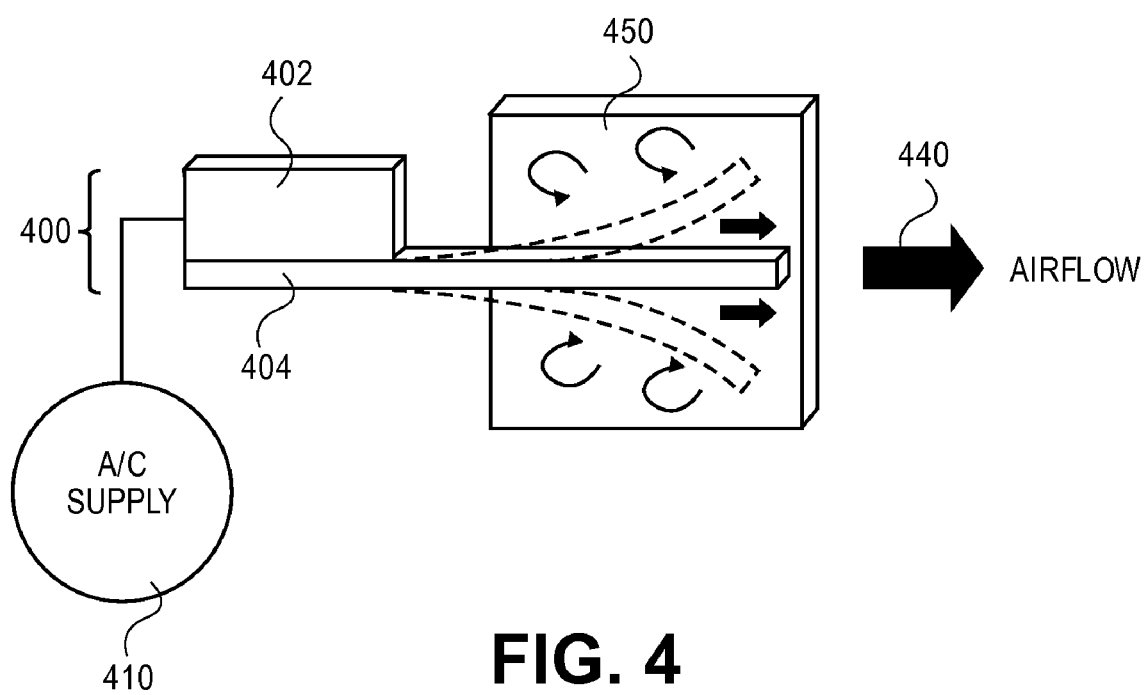
FIG. 4 illustrates the cooling of a semiconductor package by a fan having a piezoelectric actuator with polymeric electrically conductive electrode layers, in accordance with an embodiment of the present invention.

A piezoelectric actuator fan incorporating polymeric electrically conductive electrodes may be used to cool a computing device by forced-air convection. FIG. 4 illustrates the cooling of a semiconductor package by a fan having a piezoelectric actuator with polymeric electrically conductive electrode layers, in accordance with an embodiment of the present invention.

Referring to FIG. 4, a piezoelectric actuator fan 400 is comprised of a multi-layer piezoelectric actuator 402 coupled with a fan blade 404. Multi-layer piezoelectric actuator 402 is comprised of a stack of alternating conductive electrode layers and piezoelectric layers. The conductive electrodes of multi-layer piezoelectric actuator 402 are comprised of a polymeric conductive material. An alternating current is supplied from an A/C supply 410 to multi-layer piezoelectric actuator 402 of piezoelectric actuator fan 400. The alternating current has a frequency and supplying the alternating current piezoelectric actuator fan 400 causes fan blade 404 to vibrate at substantially the same frequency, as illustrated by the dashed lines in FIG. 4. An airflow 440 is generated orthogonally from the direction of the tip-to-tip displacement of fan blade 404 and away from piezoelectric actuator fan 400.

Piezoelectric actuator fan 400 may be arranged proximate to a heat-generating device in order to cool the device by forced-air convection. Referring again to FIG. 4, a semiconductor package 450 is arranged proximate to piezoelectric actuator fan 400 such that heated air on the surface of semiconductor package 450 is displaced. Semiconductor package 450 may be arranged in relation to piezoelectric actuator fan 400 in any configuration which enables the removal of heated air from the surface of semiconductor package 450 yet which optimizes the packing arrangement for small and/or mobile electronics products. In one embodiment, semiconductor package 450 is arranged underneath the span of the tip-to-tip displacement of fan blade 404, as depicted in FIG. 4. In an alternative embodiment, semiconductor package 450 is arranged at the end of the span of the tip-to-tip displacement of fan blade 404.

Semiconductor package 450 may be comprised of any packaged semiconductor die or group of dice. In one embodiment, semiconductor package 450 comprises a packaged microprocessor formed from a silicon substrate. In another embodiment, semiconductor package 450 comprises a packaged diode formed on a III-V material substrate. Semiconductor package 450 may be a packaged platform of several units housed together. For example, in an embodiment, semiconductor package 450 comprises a packaged microprocessor die coupled with an RF die for wireless connectivity. Semiconductor package 450 may comprise a packaged chip with a surface comprising a micro-electronic integrated circuit. In one embodiment, the chip has a surface comprising an array of CMOS transistors connected with connectors through a series of metal interconnects. The connectors may be any entity suitable to externally connect the chip with an outside circuitry. In one embodiment, the connectors are comprised of a series of wires connected with external solder balls. In another embodiment, the connectors are comprised of optical waveguides for transmitting an optical signal to an outside circuitry. In an embodiment, the connectors are comprised of tape connectors with electrical traces formed therein.

Figure 5:
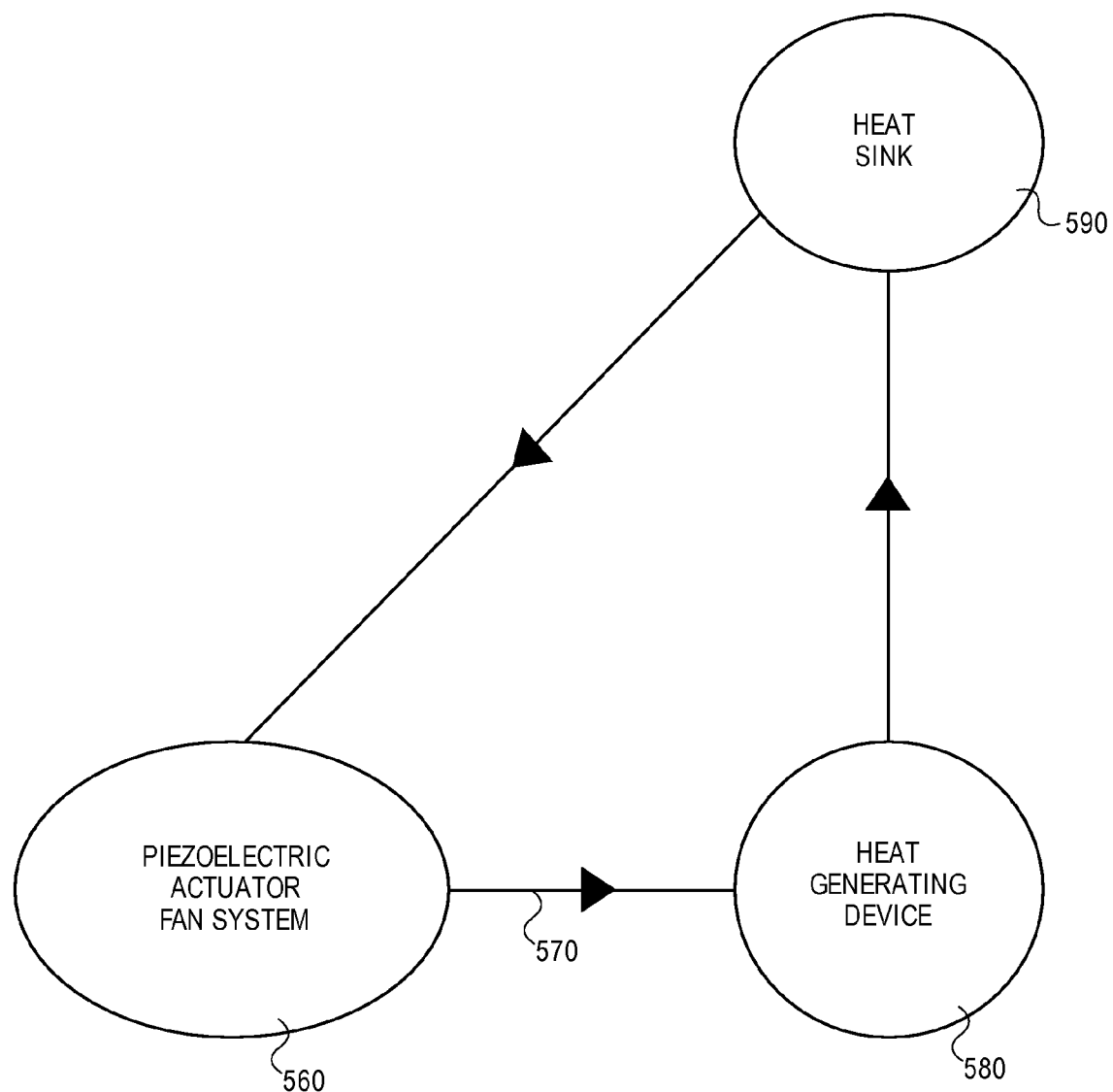
FIG. 5 illustrates a system including a fan having a piezoelectric actuator with polymeric electrically conductive electrode layers, in accordance with an embodiment of the present invention.

A piezoelectric actuator fan incorporating polymeric electrically conductive electrodes may be used to cool a computing device by forced-air convection in conjunction with a heat sink. FIG. 5 illustrates a system including a fan having a piezoelectric actuator with polymeric electrically conductive electrode layers, in accordance with an embodiment of the present invention.

Referring to FIG. 5, a piezoelectric actuator fan system 560 is incorporated into an airflow path 570 in a small and/or hand-held device. The airflow path 570 is determined by piezoelectric actuator fan system 560, as depicted by the arrows, and is in line with a heat generating device 580 and a heat sink 590. Piezoelectric actuator fan system 560 comprises a multi-layer piezoelectric actuator connected with a fan blade and an A/C supply, as described in association with piezoelectric actuator fan 400 from FIG. 4. The multi-layer piezoelectric actuator is comprised of a stack of alternating conductive electrode layers and piezoelectric layers. The conductive electrodes of multi-layer piezoelectric actuator are comprised of a polymeric conductive material. Heat generating device 580 may be any semiconductor package described in association with semiconductor package 450 from FIG. 4. Furthermore, the arrangement of piezoelectric actuator fan system 560 and heat generating device 580 may be any configuration described in association with the arrangement of piezoelectric actuator fan 400 and semiconductor package 450 from FIG. 4.

Heat sink 590 may be comprised of any mechanism or material capable of displacing heat from a small or hand-held electronics device. In an embodiment, heat sink 590 is comprised of a series of heat pipes arranged in a radiator fashion. In another embodiment, heat sink 590 is comprised of a radiator. The radiator may be formed having a maximized surface area in order to enable a highly efficient heat displacement scheme. In one embodiment, the radiator is comprised of micro-fins. Heat sink 590 may further comprise a heat interface layer for providing a buffer between heat generating device 580 and heat sink 590. In one embodiment, the heat interface layer is comprised of micro-channels for rapid thermal transport. Alternatively, heat sink 590 may not comprise a heat interface layer between heat generating device 580 and heat sink 590. In accordance with an alternative embodiment of the present invention, heat generating device 580 is comprised of a bulk silicon substrate, the back side of which provides a sufficient thermal buffer to enable direct contact between heat generating device 580 and heat sink 590.

The arrangement of piezoelectric actuator fan system 560, heat generating device 580 and heat sink 590 may be made to optimize the cooling of heat generating device 580 through forced-air convection via airflow path 570. In one embodiment, the cooling is optimized within the confines of a small and/or hand-held electronics computing device. Thus, although the use of an increased number of layers in the multi-layer piezoelectric actuator comprising polymeric electrically conductive electrode layers enables a reduced amount of required input voltage to displace the fan blade, there may be a physical limit to the number of layers that may be included before airflow path 570 is blocked. Thus, in accordance with an embodiment of the present invention, the number of alternating piezoelectric and conductor layers in a piezoelectric fan is optimized in relation to the size of the airflow path in a small and/or hand-held device.

Thus, a multi-layer piezoelectric actuator with conductive polymer electrodes has been disclosed. In an embodiment, the piezoelectric actuator comprises a stack of alternating conductive electrode layers and piezoelectric layers. The conductive electrode layers are comprised of a polymeric electrically conductive material. In another embodiment, a device for cooling by forced-air convection comprises a fan blade, a piezoelectric actuator and an alternating current supply. The piezoelectric actuator is coupled with the fan blade and is comprised of a stack of alternating conductive electrode layers and piezoelectric layers, wherein the conductive layers are comprised of a polymeric electrically conductive material. The alternating current supply is coupled with the piezoelectric actuator and is for vibrating the fan blade. In one embodiment, a method of cooling by forced-air convection comprises supplying an alternating current to the piezoelectric actuator, wherein the alternating current has a frequency and causes the fan blade to vibrate at the same frequency.

What is claimed is:

1. A piezoelectric actuator, comprising:
    a stack of alternating conductive electrode layers and ceramic piezoelectric layers, wherein the conductive electrode layers are comprised of a polymeric electrically conductive material.

2. The piezoelectric actuator of claim 1 wherein said polymeric electrically conductive material has a low modulus of elasticity.

3. The piezoelectric actuator of claim 2 wherein said polymeric electrically conductive material has a modulus of elasticity in the range of 5-50 MPa.

4. The piezoelectric actuator of claim 2 wherein said polymeric electrically conductive material is selected from the group consisting of dispersed polyaniline, polyacetylene, polypyrrole, polythiophene, polynaphthalene and derivatives thereof.

5. The piezoelectric actuator of claim 4 wherein said polymeric electrically conductive material has a conductivity of at least $1 \times 10^{-5}$ S/cm.

6. The piezoelectric actuator of claim 1 wherein the thickness of each of the conductive electrode layers in said stack is less than approximately 10 microns.

7. The piezoelectric actuator of claim 6 wherein the number of conductive electrode layers in said stack is in the range of 2-50.

8. The piezoelectric actuator of claim 1 wherein the ceramic piezoelectric layers are comprised of a ceramic material selected from the group consisting of lead zirconium titanate (PZT) and a lead-free ceramic material exhibiting a strong piezoelectric effect.

9. The piezoelectric actuator of claim 1 wherein said stack is a component of a system selected from the group consisting of a fan, a blower, a synthetic jet, a fluid pump, a compressor, a positioning system and a buzzer.

10. A device for cooling by forced-air convection, comprising:
a fan blade;
a piezoelectric actuator coupled with said fan blade, wherein said piezoelectric actuator is comprised of a stack of alternating conductive electrode layers and ceramic piezoelectric layers, and wherein the conductive layers are comprised of a polymeric electrically conductive material; and
an alternating current supply coupled with said piezoelectric actuator, wherein said alternating current supply is for vibrating said fan blade.

11. The device of claim 10 wherein said polymeric electrically conductive material has a low modulus of elasticity.

12. The device of claim 11 wherein said polymeric electrically conductive material has a modulus of elasticity in the range of 5-50 MPa.

13. The device of claim 11 wherein said polymeric electrically conductive material is selected from the group consisting of dispersed polyaniline, polyacetylene, polypyrrole, polythiophene, polynaphthalene and derivatives thereof 14. The device of claim 13 wherein said polymeric electrically conductive material has a conductivity of at least $1\times10^{-5}$ S/cm.

15. The device of claim 10 wherein the thickness of each of the conductive electrode layers in said stack is less than approximately 10 microns.

16. The device of claim 15 wherein the number of conductive electrode layers in said stack is in the range of 2-50.

17. The device of claim 10 wherein the ceramic piezoelectric layers are comprised of a ceramic material selected from the group consisting of lead zirconium titanate (PZT) and a lead-free ceramic material exhibiting a strong piezoelectric effect.

18. A method of cooling by forced-air convection, comprising:
providing a piezoelectric actuator connected with a fan blade, wherein said piezoelectric actuator is comprised of a stack of alternating conductive electrode layers and ceramic piezoelectric layers, and wherein the conductive electrode layers are comprised of a polymeric conductive material; and
supplying an alternating current to said piezoelectric actuator, wherein said alternating current has a frequency, and wherein supplying said alternating current causes said fan blade to vibrate at said frequency.

19. The method of claim 18 wherein said frequency is less than approximately 100 Hz.

20. The method of claim 18 wherein said frequency is greater than approximately 20 kHz.

21. The method of claim 18 wherein said polymeric electrically conductive material has a low modulus of elasticity.

22. The method of claim 21 wherein said polymeric electrically conductive material has a modulus of elasticity in the range of 5-50 MPa.

23. The method of claim 21 wherein said polymeric electrically conductive material is selected from the group consisting of dispersed polyaniline, polyacetylene, polypyrrole, polythiophene, polynaphthalene and derivatives thereof.

24. The method of claim 23 wherein said polymeric electrically conductive material has a conductivity of at least $1\times10^{-5}$ S/cm.

25. The method of claim 18 wherein the thickness of each of the conductive electrode layers in said stack is less than approximately 10 microns.

26. The method of claim 25 wherein the number of conductive electrode layers in said stack is in the range of 2-50.

27. The method of claim 18 wherein the ceramic piezoelectric layers are comprised of a ceramic material selected from the group consisting of lead zirconium titanate (PZT) and a lead-free ceramic material exhibiting a strong piezoelectric effect.

28. The piezoelectric actuator of claim 8, wherein said ceramic piezoelectric layers are comprised of said lead-free ceramic material, and wherein said lead-free ceramic material is selected from the group consisting of $(K_{0.44}Na_{0.52}Li_{0.04})(Nb_{0.86}Ta_{0.10}Sb_{0.04})O_3$ and $\{(K_{0.5}Na_{0.5})_{1-x}Li_x\}(Nb_{1-y}Ta_y)O_3$ where x and y=0.06 and 0, 0.04 and 0.10, or 0.03 and 0.20.

29. The piezoelectric actuator of claim 17, wherein said ceramic piezoelectric layers are comprised of said lead-free ceramic material, and wherein said lead-free ceramic material is selected from the group consisting of $(K_{0.44}Na_{0.52}Li_{0.04})(Nb_{0.86}Ta_{0.10}Sb_{0.04})O_3$ and $\{(K_{0.5}Na_{0.5})_{1-x}Li_x\}(Nb_{1-y}Ta_y)O_3$ where x and y=0.06 and 0, 0.04 and 0.10, or 0.03 and 0.20.

30. The piezoelectric actuator of claim 27, wherein said ceramic piezoelectric layers are comprised of said lead-free ceramic material, and wherein said lead-free ceramic material is selected from the group consisting of $(K_{0.44}Na_{0.52}Li_{0.04})(Nb_{0.86}Ta_{0.10}Sb_{0.04})O_3$ and $\{(K_{0.5}Na_{0.5})_{1-x}Li_x\}(Nb_{1-y}Ta_y)O_3$ where x and y=0.06 and 0, 0.04 and 0.10, or 0.03 and 0.20.

* * * * *